US007633762B2

(12) United States Patent
Yonezawa et al.

(10) Patent No.: US 7,633,762 B2
(45) Date of Patent: Dec. 15, 2009

(54) GROUND STRUCTURE FOR A TUNER

(75) Inventors: Hideo Yonezawa, Osaka (JP); Naohito Doi, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 12/222,779

(22) Filed: Aug. 15, 2008

(65) Prior Publication Data

US 2009/0046443 A1 Feb. 19, 2009

(30) Foreign Application Priority Data

Aug. 17, 2007 (JP) ............................. 2007-212699

(51) Int. Cl.
*H05K 9/00* (2006.01)

(52) U.S. Cl. ........................ 361/753; 361/799; 361/800; 361/816; 361/818; 361/814; 174/350; 174/351

(58) Field of Classification Search ................. 361/753, 361/799, 816, 818, 714; 174/350, 351
See application file for complete search history.

(56) References Cited

U.S. PATENT DOCUMENTS 5,583,750 A 12/1996 Nakata et al.

FOREIGN PATENT DOCUMENTS

| | | |
|---|---|---|
| DE | 33 35 664 A1 | 4/1985 |
| GB | 2 433 357 A | 6/2007 |
| JP | 63-147896 U | 9/1988 |
| JP | 08-107286 | 4/1996 |
| JP | 2005-295020 | 10/2005 |
| JP | 2007-207370 | 8/2007 |

*Primary Examiner*—Dameon E Levi
(74) *Attorney, Agent, or Firm*—Morgan Lewis & Bockius LLP

(57) ABSTRACT

On a circuit board to be mounted on a metal chassis, a tuner having a metal sleeve protruding from a side of its case is mounted, with the sleeve protruding beyond an edge of the circuit board. A metal ground plate is fitted on the sleeve. With a flexible leg portion formed at a lower portion of the ground plate disposed on the chassis, the circuit board is fixed to the chassis with screws, thereby the leg portion comes into elastic contact with the chassis.

3 Claims, 5 Drawing Sheets

GROUND STRUCTURE FOR A TUNER

This application is based on Japanese Patent Application No. 2007-212699 filed on Aug. 17, 2007, the contents of which are hereby incorporated by reference.

BACKGROUND OF THE INVENTION

1. Field of the Invention

The present invention relates to a ground structure for a tuner in an electronic apparatus.

2. Description of the Related Art

Conventionally, to reduce electro-magnetic interference caused by unintended radiation from an electronic apparatus which has a tuner or a high-frequency circuit, various ground structures have been developed. Such examples can be seen in the following documents.

JP-A-2005-295020 discloses a ground structure where a grounding leg of an electroconductive portion of a tuner facing a circuit board and an electroconductive portion of the circuit board are connected to form a first grounding. And an electroconductive portion of the tuner which does not face the circuit board and an electroconductive portion other than the circuit board are connected with a lead to form a second grounding.

JP-U-1988-147896 discloses a shield case for a tuner in which a ground plate having an elastic tongue is mounted on an engagement piece of a metal frame which supports a printed circuit board disposed in a metal frame body, and the elastic tongue touches a metal shield cover covering over the metal frame body.

JP-A-1996-107286 discloses a mounting structure for an electronic circuit apparatus where a ground conductive film, which is patterned on a bottom surface of a printed circuit board, touches a circuit-board contact portion of a lower shield box, and the inner surface of a side wall of an upper shield box touches a between-box contact portion of the lower shield box, thereby the upper and lower spaces of a high-frequency circuit block are shielded by both shield boxes.

When a circuit board having a tuner is mounted on a metal chassis, it is necessary to make a grounding between the tuner and the chassis. Conventionally, when fixing a tuner to a circuit board with a screw, one end of a metal ground plate was fitted into the tuner and fixed to the circuit board with the screw by fastening together, and the other end of the ground plate was made touch the chassis. In this structure, the ground plate had to have a length to reach from an edge of the circuit board to the screw-fixed portion, accordingly the ground plate became bulky and its shape was complicated.

SUMMARY OF THE INVENTION

The present invention has been made to cope with the above-mentioned problems, and it is an object of the present invention to provide a ground structure for a tuner which enables, through mounting of a circuit board with a tuner on a metal chassis, an easy and secure ground connection between the tuner and the chassis.

To achieve the above-described object, a ground structure for a tuner, which is used when a circuit board with a tuner is mounted on a metal chassis, comprises:

a case of the tuner;

a metal sleeve protruding from a side surface of the case;

a metal ground plate; and a flexible leg portion formed at a lower portion of the ground plate, wherein the tuner is mounted on the circuit board with the sleeve protruding beyond an edge of the circuit board, the ground plate is fitted on the sleeve, the flexible leg portion is disposed on the chassis, and the circuit board is fixed to the chassis with a screw and thereby the leg portion comes into elastic contact with the chassis.

According to this structure, the ground plate needs only to be large enough to fit in a space between the tuner sleeve portion protruding beyond the edge of the circuit board and the chassis, and there is no need to make the ground plate any larger. The shape of the ground plate can be made simple. And with the ground plate being fitted on the sleeve, by fixing the circuit board to the chassis with a screw, the tuner is grounded to the chassis, thereby simplifying the grounding.

The present invention is characterized in that in the above-described ground structure, a tongue piece, which elastically touches the outer surface of the sleeve, is provided on an inner edge of a though-hole formed through the ground plate through which the sleeve is inserted.

According to this structure, it is possible to surely form and maintain an electric connection between the sleeve and the ground plate.

The present invention is characterized in that in the above-described ground structure for a tuner, the leg potion of the ground plate is comprised of leg pieces, one of which is extending from a side of the ground plate and slanted in one direction, the other of which is extending from the opposite side of the ground plate and slanted in the opposite direction.

According to this structure, when the ground plate is pushed against the chassis, the ground plate will not fall down in any direction, thereby the ground plate is prevented from coming off the sleeve.

DESCRIPTION OF THE DRAWINGS

These and other objects and characteristics of the present invention will be cleared by explanation of the preferred embodiments. The explanation will be made referring to the following drawings.

DESCRIPTION OF THE PREFERRED EMBODIMENTS

Hereinafter, embodiments of the present invention will be described with reference to FIGS. 1 to 5. These embodiments are only examples of ground structures for a tuner embodying the technical features of the present invention, and the present invention is not limited to these embodiments. The present invention can be embodied in various modifications which are made within the technical concept described in the claims.

Figure 1:
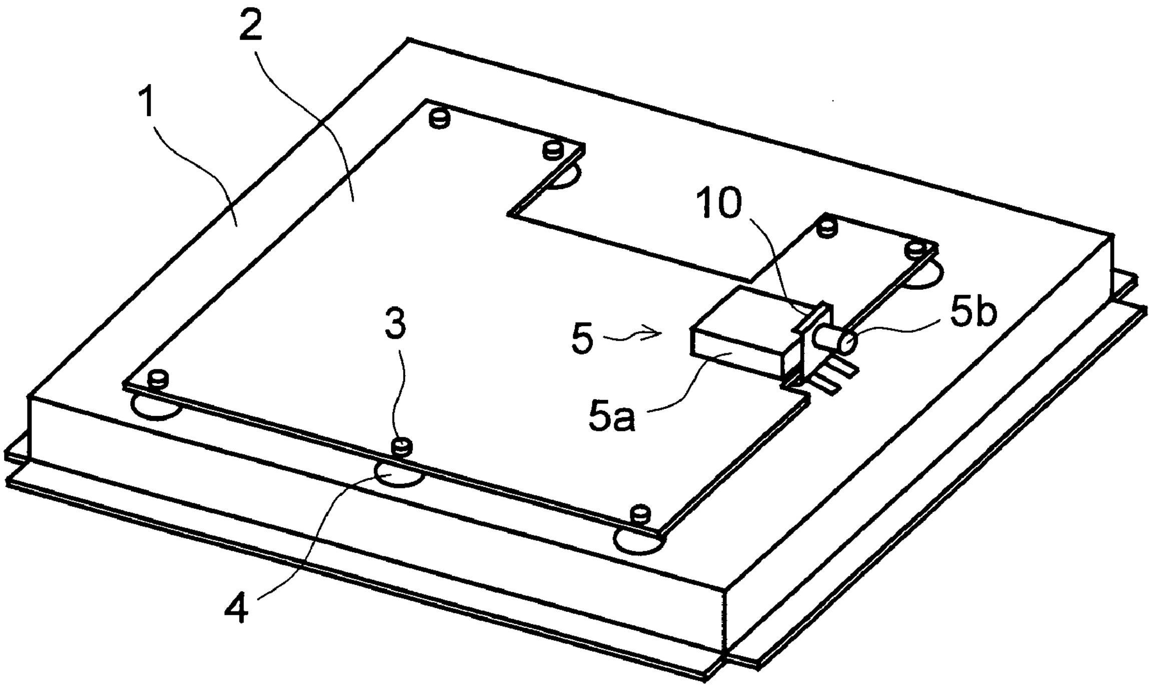
FIG. 1 is a perspective view showing a state where a circuit board is mounted on a chassis.
Figure 2:
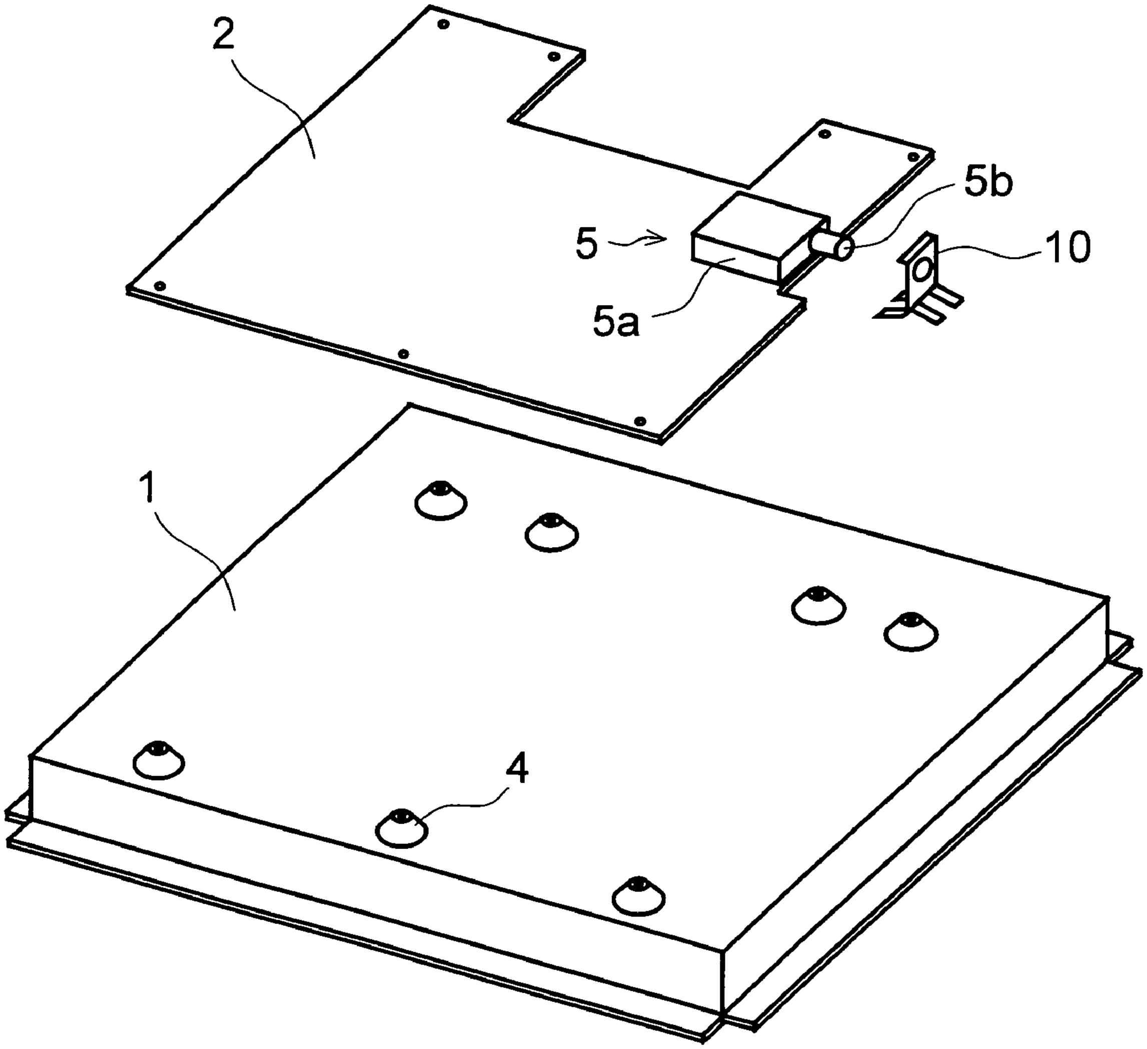
FIG. 2 is an exploded view of a chassis, a circuit board, and a ground plate.
Figure 3:
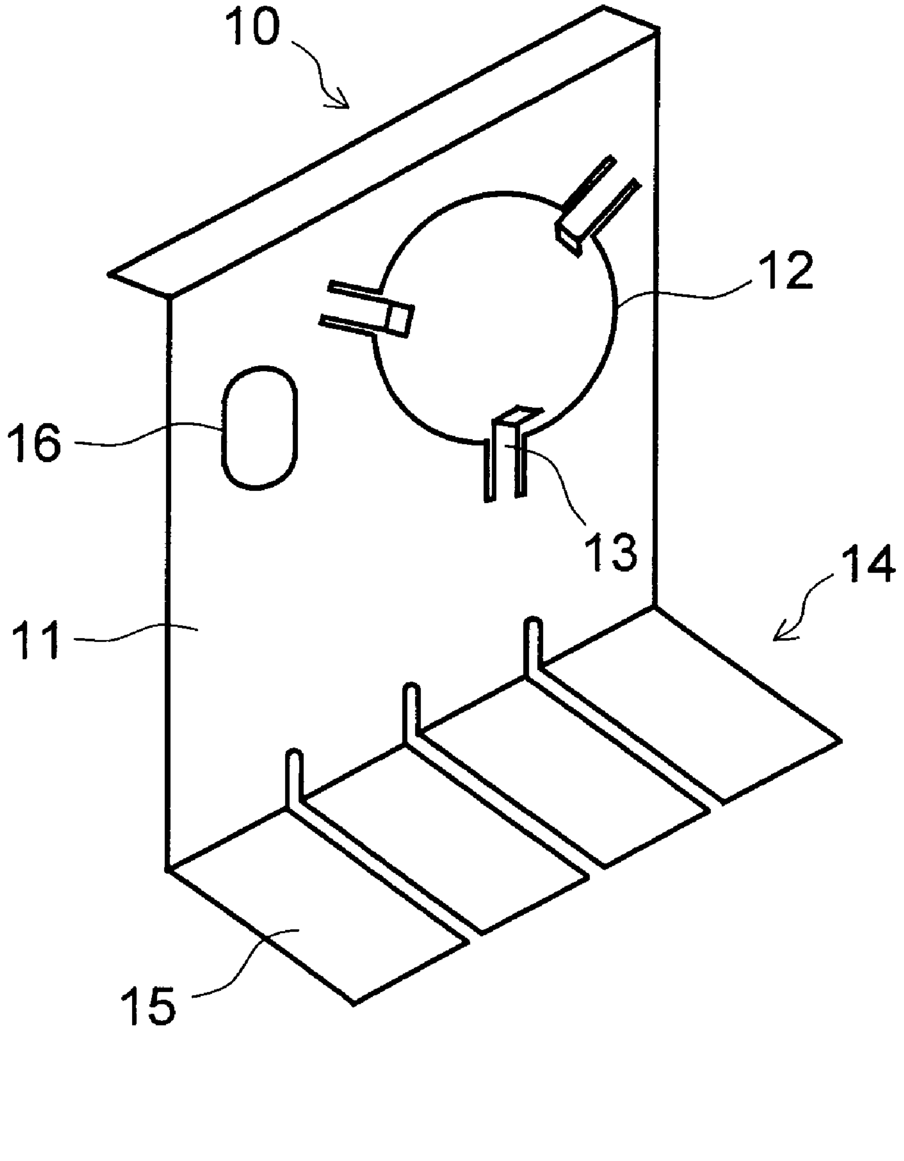
FIG. 3 is a perspective view of a ground plate.

In FIG. 1, the reference number 1 shows a metal chassis. The chassis 1 includes a shallow dish which is so formed as to have a rectangular shape by bending the edges of a sheet metal, and is disposed upside down. Screwing pedestals 4 to fix a circuit board 2 with screws 3 are formed by embossing some places of the top surface of the chassis 1. The screwing pedestal 4 has a cone-trapezoidal shape, and the circuit board 2 is lifted from the chassis 1 by the height of the screw stop pedestal 4 and is supported by the chassis 1.

A tuner 5 is mounted on the top surface of the circuit board 2. The tuner includes a metal case 5*a* which is formed in a shape of a rectangular parallelepiped, and a cylindrical metal sleeve 5*b* protruding horizontally from one side of the case 5*a*. The sleeve 5 is used as a radio frequency (RF) terminal and includes a thread groove formed on its outer surface. The tuner 5 is fixed to the circuit board 2 with screws (not shown) with the sleeve 5*b* protruding beyond an edge of the board.

A metal ground plate 10 makes a ground connection between the tuner 5 and the chassis 1. The ground plate 10 is formed by pressing a thin metal plate and has a structure shown in FIG. 3. A vertical plate portion 11, which is the main part of the ground plate 10, is provided with a through-hole 12 through which the sleeve 5*b* is inserted. Three tongue pieces 13, which touch elastically the outer surface of the sleeve 5, are cut out on the inner edge of the through-hole 12 at intervals of 120°. The tip ends of the tongue pieces 13 are bent in one direction.

At the lower end of the vertical plate portion 11, a flexible leg portion 14 is unitarily formed. In the embodiment shown in FIG. 3, four leg pieces 15, which extend from the vertical plate portion 11 in a bit downwardly slanted angle rather than a right angle, comprise the leg portion 14. In a modification shown in FIG. 4, four leg pieces 15 comprise the leg portion 14, two of which extend slantingly from one side of the vertical plate portion 11 and the other two of which extend slantingly from the other side of the vertical plate portion 11. The leg pieces 15 have the same length and angle on both sides.

Before the circuit board 2 is mounted on the chassis 1, the ground plate 10 is fitted on the sleeve 5*b* of the tuner 5. As described above, because the tongue pieces 13 are bent in one direction, that is, towards the right side in FIG. 5, the sleeve 5*b* is inserted into the though-hole 12 from the left side of the vertical plate portion 11. The sleeve 5*b* smoothly goes through the through-hole 12, keeping elastic contact with the tongue pieces 13. After the sleeve 5*b* is inserted, as the tip ends of the tongue pieces 13 engage with the thread groove of the sleeve 5*b*, the ground plate 10 will not come off the sleeve 5*b* easily.

A screw hole 16 is formed alongside the through-hole 12. After the ground plate 10 is fitted until the it touches the case 5*a*, a screw is threaded into the case 5*a* via the screw hole 16 to securely fix the ground plate 10 to the tuner 5.

After the ground plate 10 is fixed to the tuner 5 as described above, by placing the circuit board 2 on the chassis 1, the leg portion 14 of the ground plate 10 is disposed on the chassis 1. When screws 3 are screwed through the circuit board 2 into the screwing pedestals 4, the ground plate 10 is pushed against the chassis 1 as the fastening becomes tight, and the leg portion 14 comes into elastic contact with the chassis 1. Thus the tuner 5 and the chassis 1 are connected to form a grounding.

Figure 4:
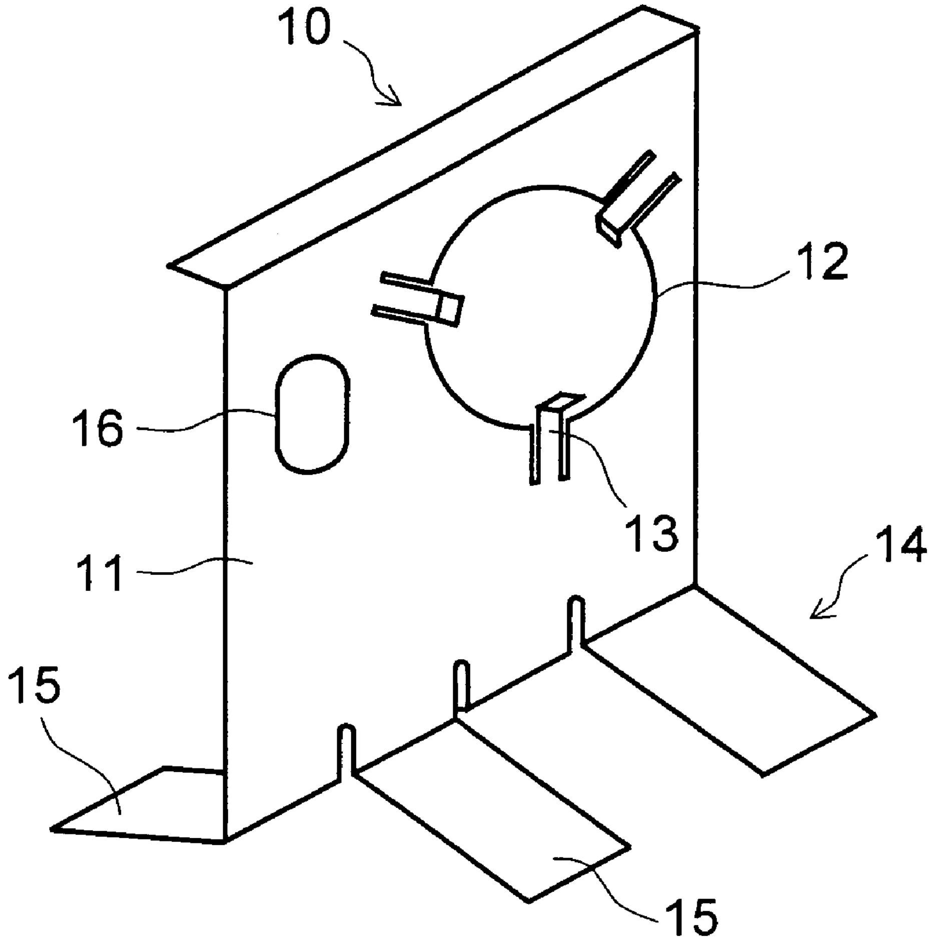
FIG. 4 is a perspective view showing a modified ground plate.
Figure 5:
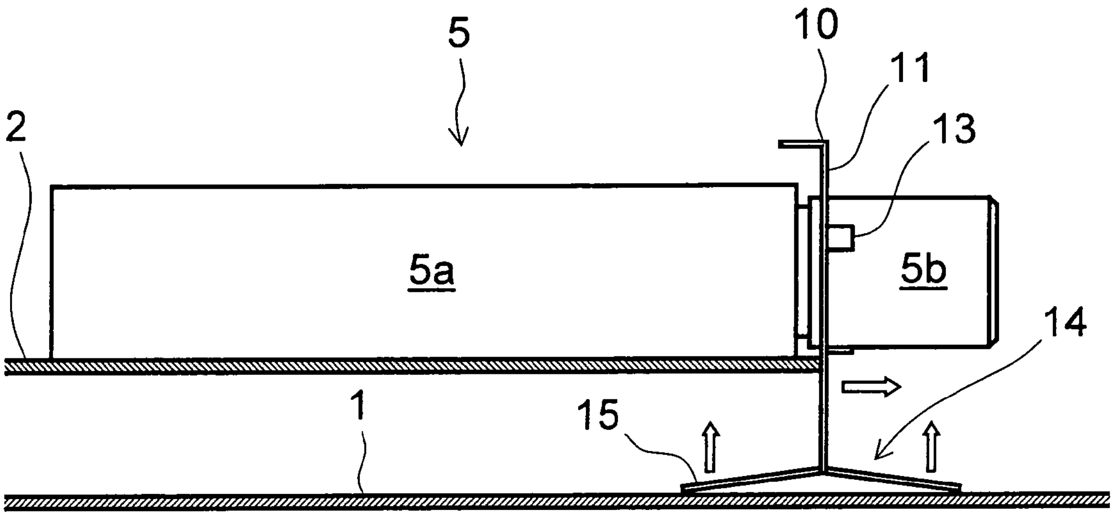
FIG. 5 is a side view showing the behavior of the ground plate shown in FIG. 4.

When the ground plate 10 has the shape shown in FIG. 4, push-up force is generated equally on both sides of the vertical plate portion 11 as shown in FIG. 5. Accordingly, lateral force represented by a horizontal arrow in FIG. 5 will not act on the ground plate 10 to make it lean, and the combination of the sleeve 5*b* and the ground plate 10 does not become dynamically unstable.

What is claimed is:

1. A ground structure for a tuner mounted on a circuit board disposed on a metal chassis, comprising:
   a case of the tuner;
   a metal sleeve protruding from a side surface of the case;
   a metal ground plate; and
   a flexible leg portion formed at a lower portion of the ground plate,
   wherein the tuner is mounted on the circuit board with the sleeve protruding beyond an edge of the circuit board,
   the ground plate is fitted on the sleeve,
   the flexible leg portion is disposed on the chassis,
   the circuit board is fixed to the chassis with a screw,
   the circuit board and part of the chassis to which the circuit board is fixed are disposed so that the respective surfaces are parallel to each other,
   the vertical plate portion of the ground plate that is fitted on the sleeve of the tuner extends perpendicularly to a surface of the circuit board and protrudes toward the chassis, and
   when the circuit board is fixed to the chassis with a screw, the flexible leg portion of the ground plate is pushed against the chassis to come into elastic contact with the chassis.

2. The ground structure for a tuner according to claim 1, further comprising a tongue piece formed on an inner edge of a through-hole which is formed through the ground plate to allow the insertion of the sleeve, the tongue piece elastically touches the outer surface of the sleeve.

3. The ground structure for a tuner according to claim 1 or 2, wherein the leg portion of the ground plate includes a leg piece extending slantingly from one side of the ground plate and a leg piece extending slantingly from the other side of the ground plate.

* * * * *